(12) United States Patent
Gonzalez Moreno et al.

(10) Patent No.: US 8,917,115 B2
(45) Date of Patent: Dec. 23, 2014

(54) ZERO CROSSING DETECTOR (ZCD) CIRCUIT

(71) Applicant: Marvell World Trade Ltd., St. Michael (BB)

(72) Inventors: Jose Luis Gonzalez Moreno, Xirivella (ES); Alejandro Acuna Munoz, Valencia (ES); Pedro Antonio Martinez Corisco, Alboraya (ES); Mario Bruno Navarro Primo, Valencia (ES); Antonio Pairet Molina, Sagunto (ES); Riccardo Tonietto, Lausanne (CH)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/861,353

(22) Filed: Apr. 11, 2013

(65) Prior Publication Data

US 2013/0271184 A1  Oct. 17, 2013

Related U.S. Application Data

(60) Provisional application No. 61/622,896, filed on Apr. 11, 2012, provisional application No. 61/732,608, filed on Dec. 3, 2012.

(51) Int. Cl.
*H03K 5/153* (2006.01)

(52) U.S. Cl.
USPC .............................................. 327/78; 327/79

(58) Field of Classification Search
USPC ....................................................... 327/78, 79
See application file for complete search history.

(56) References Cited

U.S. PATENT DOCUMENTS

| 4,399,414 | A | 8/1983 | Bird |
| 7,271,550 | B2 * | 9/2007 | Vanderzon ................... 315/291 |
| 7,362,149 | B1 | 4/2008 | Cheah et al. |
| 7,468,878 | B2 * | 12/2008 | Deurloo et al. .............. 361/93.8 |
| 8,664,885 | B2 * | 3/2014 | Koolen et al. ................ 315/291 |
| 2011/0279163 | A1 | 11/2011 | Barnett et al. |

FOREIGN PATENT DOCUMENTS

| CA | 2628211 A1 | 1/2003 |
| DE | 3142558 A1 | 6/1982 |
| DE | 19642871 A1 | 4/1998 |
| DE | 102005030634 A1 | 1/2007 |
| EP | 2104401 A1 | 9/2009 |
| FR | 2876799 A1 | 4/2006 |

OTHER PUBLICATIONS

International Search Report and Written Opinion for PCT/IB2013/001374 dated Nov. 18, 2013.

* cited by examiner

*Primary Examiner* — Kenneth B. Wells

(57) ABSTRACT

A system for detecting a Zero Crossing point is provided. The system includes: a coupling unit connected between a high voltage side and a low voltage side of the system; and a zero crossing detector connected to the high voltage side and configured to divide a filtered mains voltage signal and to generate an output signal that indicates a zero crossing point of the filtered mains voltage signal.

22 Claims, 8 Drawing Sheets

ZERO CROSSING DETECTOR (ZCD) CIRCUIT

CROSS REFERENCE TO RELATED APPLICATIONS

This application claims the benefit of and priority to U.S. Provisional Application 61/622,896, filed 11 Apr. 2012, and U.S. Provisional Application 61/732,608, filed 3 Dec. 2012, which are both incorporated by reference.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Various countries or regions differ in standards in the distribution of mains electricity. The mains voltage signal is an example of mains electricity that is distributed and that is used to power various devices such as lighting, portable appliances, home networking nodes (e.g., multimedia home networking nodes), other networked nodes, and/or other systems and/or devices that require power. A mains voltage signal is also commonly referred to as a line voltage or as a domestic mains signal. As an example, the mains voltage is approximately 120 Vrms (at a frequency of approximately 60 Hz) in the United States, and approximately 230 Vrms (at a frequency of approximately 50 Hz) in Spain. Other countries and/or regions vary in their rules on the distribution of the mains voltage.

For safety reasons, the mains voltage circuitry for delivering the mains voltage signal is electrically isolated from low voltage circuitries for powering various devices such as, for example, appliances, home networking nodes, and/or other networked nodes. Additionally, a zero crossing detector is typically used to provide synchronization with the mains voltage cycle of the mains voltage signal. This synchronization of the mains voltage cycle allows for synchronized communications among and/or between the low voltage circuitries in the nodes in a network.

A zero crossing detector will detect the zero crossing point of the mains voltage signal, and this zero crossing point indicates a space location (with respect to time) of the mains voltage signal. The detection of the zero crossing point of the mains voltage signal is used for synchronizing the mains voltage cycle.

FIGURES

Non-limiting and non-exhaustive embodiments of the present disclosure are described with reference to the following figures.

SUMMARY

In one embodiment of the disclosure, a method for detecting a Zero Crossing point is provided. The method includes: filtering noise in a mains voltage signal; dividing the mains voltage signal in order to obtain a low voltage signal; and generating an output signal from the low voltage signal, wherein the output signal indicates a zero crossing point of the mains voltage signal.

In another embodiment of the disclosure, a system for detecting a Zero Crossing point is provided. The system includes: a coupling unit connected between a high voltage side and a low voltage side of the system; and a zero crossing detector connected to the high voltage side and configured to divide a filtered mains voltage signal and to generate an output signal that indicates a zero crossing point of the filtered mains voltage signal.

In another embodiment of the disclosure, a system for detecting a Zero Crossing point is provided. The system includes: a filter for filtering noise in a mains voltage signal; a divider coupled to the filter and configured to divide the mains voltage signal in order to obtain a low voltage signal; and a zero crossing detector coupled to the divider and configured to generate an output signal from the low voltage signal, wherein the output signal indicates a zero crossing point of the mains voltage signal.

DETAILED DESCRIPTION

Reference will now be made in detail to embodiment(s) of the disclosure, an example(s) of which is (are) illustrated in the accompanying drawings. Wherever possible, the same reference numbers will be used throughout the drawings to refer to the same or like parts.

In the following detailed description, for purposes of explanation, numerous specific details are set forth to provide a thorough understanding of the various embodiments of the disclosure. Those of ordinary skill in the art will realize that these various embodiments of the disclosure are illustrative only and are not intended to be limiting in any way. Other embodiments of the disclosure will readily suggest themselves to such skilled persons having the benefit of this disclosure.

Figure 1:
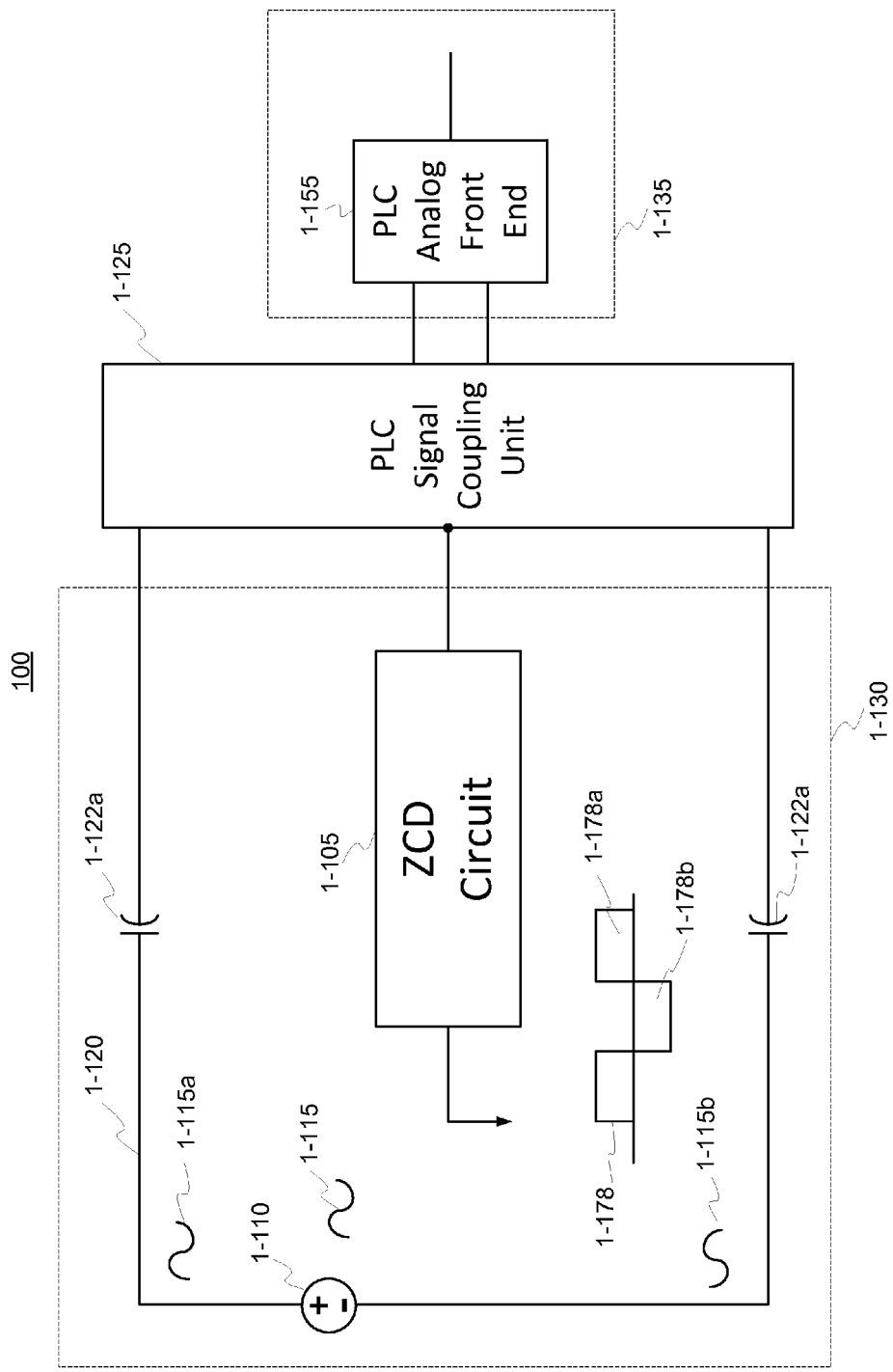
FIG. 1 is a block diagram of a system with a Zero Crossing Detection (ZCD) circuit, in accordance with an embodiment of the present disclosure.

FIG. 1 is a block diagram of a system 100 with a Zero Crossing Detection (ZCD) circuit 1-105, in accordance with an embodiment of the present disclosure. Typically, the system 100 provides a voltage source 1-110 that provides a mains voltage signal 1-115 along a power line 1-120. The mains voltage signal 1-115 is typically formed by the differential signals 1-115*a* and 1-115*b*. The signal 1-115*a* is phase-shifted compared to the signal 1-115*b*. Both signals 1-115*a* and 1-115*b* have substantially the same frequency and amplitude. The capacitors 1-122*a* and 1-122*b* are also connected to the power line 1-120.

A PLC signal coupling unit 1-125 is coupled between the high voltage side 1-130 and the low voltage side 1-135 of the system 100. One example of a coupling unit 1-125 is shown by the coupling unit 2-125 in FIG. 2. A PLC Analog Front End 1-155 is connected to the coupling unit 1-125.

In an embodiment of the disclosure, a zero cross detector (ZCD) circuit 1-105 has an input coupled to the coupling unit 1-125 and to the high voltage side 1-130 of the coupling unit 1-125. In response to the voltages 1-115*a* and 1-115*b*, the ZCD circuit 1-105 is configured to divide the values of these voltages 1-115*a* and 1-115*b* and to generate an output signal 1-178 with positive pulses 1-178*a* and negative pulses 1-178*b*. As will be discussed below, the output signal 1-178 indicates zero crossing points of the mains voltage signal 1-115. Therefore, the ZCD circuit 1-105 is configured to generate an output signal 1-178 that indicates a zero crossing point of a mains voltage signal 1-115 that is transmitted from the high voltage side 1-130.

In one embodiment, as will also be discussed in additional details below, the ZCD circuit 1-105 is configured to filter noise in a mains voltage signal 1-115 (along with L-C filter characteristics in the power line 1-120), to divide the mains voltage signal 1-115 in order to obtain a low voltage signal (e.g., signals 2-177*a* and/or 2-177*b* in FIG. 2), and to generate an output signal 1-178 from the low voltage signal. The output signal 1-178 indicates a zero crossing point of the mains voltage signal 1-115.

Figure 2:
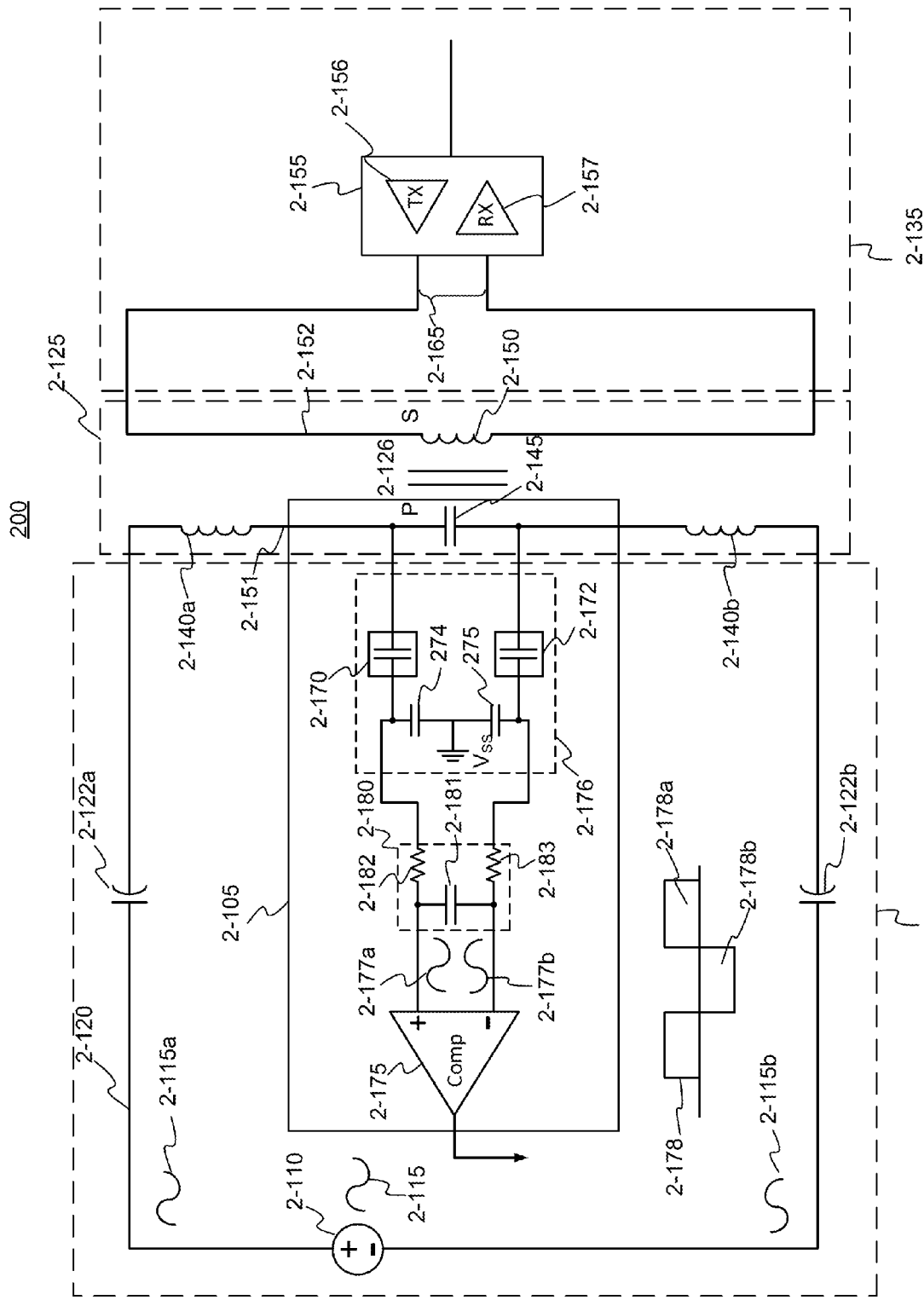
FIG. 2 is a block diagram of a system with a Zero Crossing Detection (ZCD) circuit, in accordance with another embodiment of the present disclosure.

FIG. 2 is a block diagram of a system 200 with a zero crossing detector (ZCD) circuit 2-105, in accordance with another embodiment of the disclosure. Typically, the system 200 provides a voltage source 2-110 that provides a mains voltage signal 2-115 along a power line 2-120. The mains voltage signal 2-115 is typically formed by the differential signals 2-115 *a* and 2-115 *b*. The signal 2-115 *a* is phase-shifted compared to the signal 2-115 *b*. Both signals 2-115 *a* and 2-115 *b* have substantially the same frequency and amplitude. The capacitors 2-122 *a* and 2-122 *b* are also connected to the power line 2-120. The capacitors 2-122 *a* and 2-122 *b* act as capacitive dividers with a capacitor 2-145 to generate a voltage level across the capacitor 2-145. As a result, the voltage level across the capacitor 2-145 is smaller than a level of the mains voltage signal 2-115. The capacitors 2-122 *a* and 2-122 *b* also act as low pass filters with primary side windings 2-140 *a* and 2-140 *b*, and thereby filtering high frequency noise that is superimposed on the mains voltage signal 2-115.

A PLC signal coupling unit 2-125 is coupled between the high voltage side 2-130 and the low voltage side 2-135 of the system 200. The coupling unit 2-125 includes a transformer 2-126 with the primary side windings 2-140 *a* and 2-140 *b*, and a capacitor 2-145 connected between the primary side windings 2-140 *a* and 2-140 *b*. The transformer 2-126 also includes a secondary side winding 2-150. The transformer 2-126 will attenuate the mains voltage signal 2-115 from the transformer primary side 2-151 to the transformer secondary side 2-152.

A PLC Analog Front End 2-155 is connected to the secondary side output 2-165 of the secondary windings 2-150. The PLC Analog Front End 2-155 includes a transmitter 2-156 for transmitting signals and a receiver 2-157 for receiving signals.

In an embodiment of the disclosure, the zero cross detector (ZCD) circuit 2-105 has an input coupled to the transformer primary side 2-151. The ZCD circuit 2-105 includes a first capacitor 2-170 with a first plate connected to the first primary winding 2-140*a* and to the capacitor 2-145 on the transformer primary side 2-151. The ZCD circuit 2-105 also includes a second capacitor 2-172 with a first plate connected to the second primary winding 2-140*b* and to the capacitor 2-145. The ZCD circuit 2-105 also includes a third capacitor 274 with a first plate connected to a second plate of the first capacitor 2-170. The second plate of the third capacitor 274 is connected to the ground voltage Vss.

The ZCD circuit 2-105 also includes a fourth capacitor 275 with a first plate connected to the second plate of the capacitor 2-172. The second plate of the fourth capacitor 275 is connected to the ground voltage Vss and to the second plate of the third capacitor 274.

In one embodiment of the ZCD circuit 2-105, the capacitors 2-170 and 2-172 are printed circuit board (PCB) capacitors and the capacitors 274 and 275 are discrete capacitors such as Class X or Y capacitors or ceramic capacitors. In another embodiment of the ZCD circuit 2-105, the capacitors 2-170, 2-172, 274, and 275 are discrete capacitors.

The ZCD circuit 2-105 also includes a comparator 2-175 with a positive input (+) that is connected (via the filter 2-180) to the first plate of the capacitor 274 and to the second plate of the capacitor 2-170. The comparator 2-175 also has a negative input (−) that is connected (via the filter 2-180) to the first plate of the capacitor 275 and the second plate of the capacitor 2-172.

The capacitors 2-170, 2-172, 274, and 275 form a capacitive divider 2-176 that divides the mains voltage signals 2-115*a* and 2-115*b* into the lower voltage signals 2-177*a* and 2-177*b*, respectively. As an example, if the mains voltage signal 2-115 is about 230 Vrms, the output voltage of the capacitive divider 2-176 may be, for example, about 1.0 volt.

The capacitive divider 2-176 divides voltages across each of the capacitors 2-170, 2-172, 274, and 275 in a similar manner as the voltage division performed by a resistor divider. Additionally, the capacitive divider 2-176 provides reinforced isolation to the mains voltage signal 2-115.

In an embodiment, the filter 2-180 includes a capacitor 2-181, a first resistor 2-182, and a second resistor 2-183. The positive input (+) of the comparator 2-175 is connected to a first plate of the capacitor 2-181 and a first end of the resistor 2-182. The second end of the resistor 2-182 is connected to the first plate of the capacitor 274 and the second plate of the capacitor 2-170.

The negative input (−) of the comparator 2-175 is connected to a second plate of the capacitor 2-181 and a first end of the resistor 2-183. The second end of the resistor 2-183 is connected to the first plate of the capacitor 275 and the second plate of the capacitor 2-172. The capacitors 274 and 275 are connected to ground Vss so that the common mode of the mains voltage signal 2-115 is attenuated in the same proportion as the differential mode of the mains voltage signal 2-115.

In response to the lower voltage signals 2-177*a* and 2-177*b*, the comparator 2-175 outputs an output signal 2-178 with positive pulses 2-178*a* and negative pulses 2-178*b*. As will be discussed below, the output signal 2-178 indicates zero crossing points of the mains voltage signal 2-115.

When the lower voltage signal 2-177*a* is greater than the lower voltage signal 2-177*b*, the comparator 2-175 outputs a positive pulse 2-178*a*. When the lower voltage signal 2-177*a* is less than the lower voltage signal 2-177*b*, the comparator outputs a negative pulse 2-178*b*. In such a manner, the zero crossing points that are detected by the ZCD circuit 2-105 are represented by the edges 310*a* through 310*f* (see FIG. 3) of the waveform 2-178 from the comparator 2-175.

Figure 3:
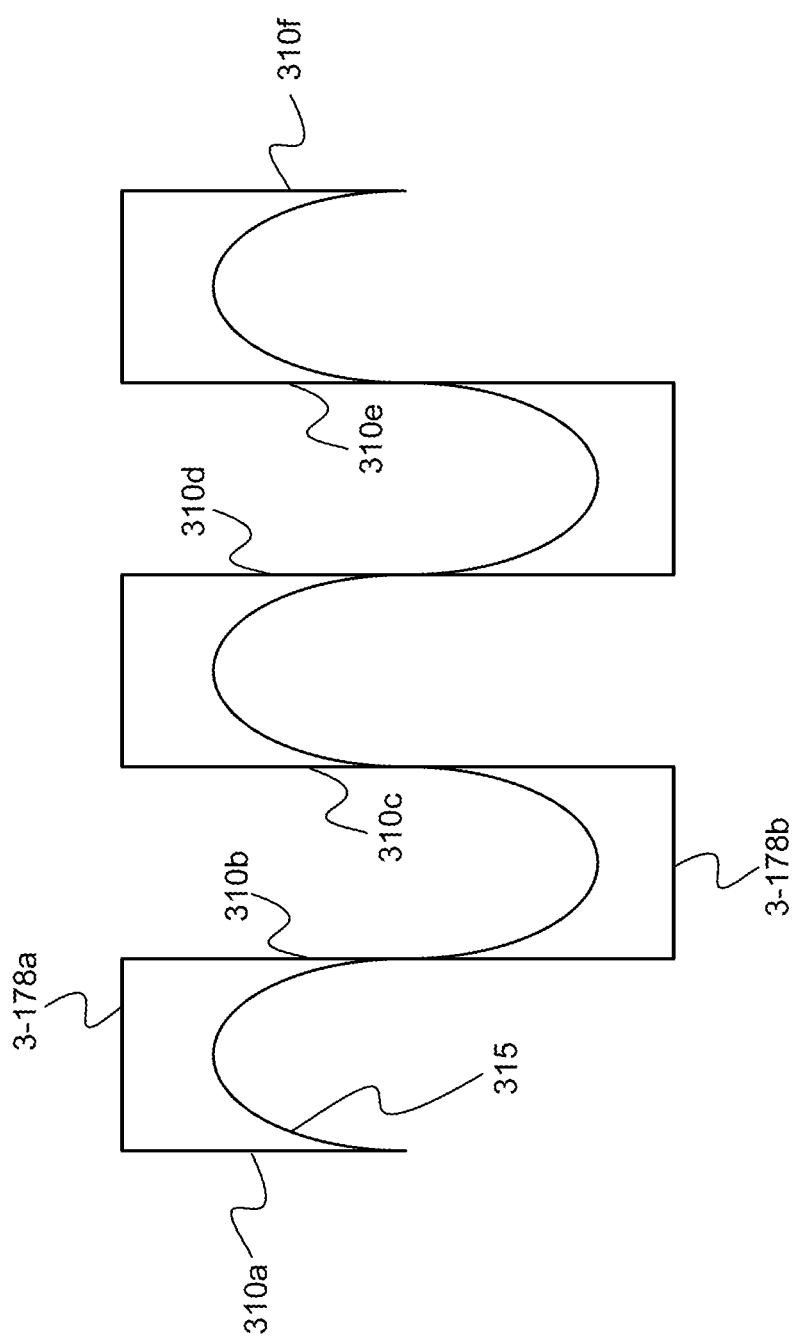
FIG. 3 illustrates various diagrams of waveforms related to an operation of a ZCD circuit, in accordance with an embodiment of the disclosure.

Reference is now made to FIGS. 2 and 3. FIG. 3 illustrates various diagrams of waveforms related to the operation of the ZCD circuit 2-105, in accordance with an embodiment of the disclosure. The zero crossing points that are detected by the ZCD circuit 2-105 are represented by the edges 310*a* through 310*f* of the waveform 3-178*a* that is output by the comparator 2-175. The waveform 315 represents the low voltage waveforms 2-177*a*.

Figure 4:
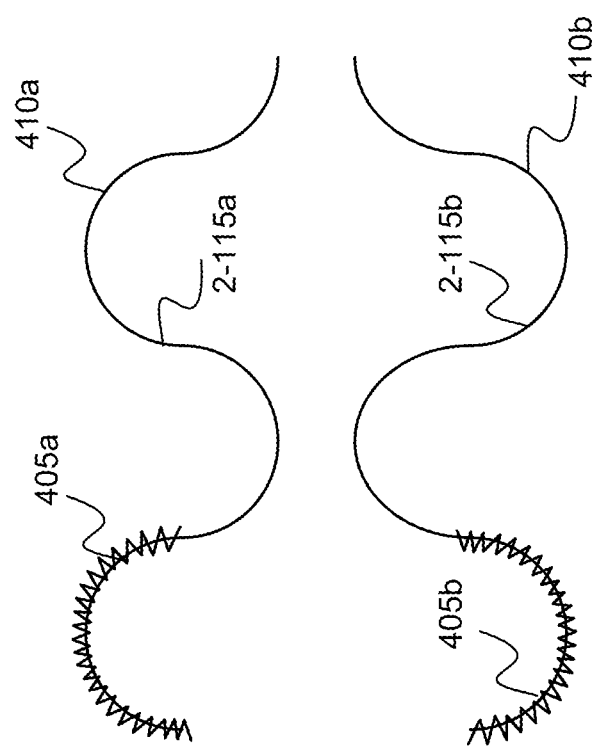
FIG. 4 illustrates various diagrams of waveforms related to the filtering of the mains voltage signals, in accordance with an embodiment of the disclosure.

Reference is now made to FIGS. 2 and 4. FIG. 4 illustrates various diagrams of waveforms related to the filtering of the mains voltage signals 2-115 *a* and 2-115 *b*, in accordance with an embodiment of the disclosure. The L-C circuit formed by the capacitor 2-122 *a* and the inductor 2-140 *a* will act as a filter for filtering the higher frequency noise 405 *a* that is superimposed on the mains voltage signal 2-115 *a*. When the capacitor 2-122 *a* and the inductor 2-140 *a* filter the noise 405 *a*, the mains voltage signal 2-115 *a* will have a smoother waveform line portion 410 *a* that indicates the filtering of noise from the signal 2-115 *a*.

The L-C circuit formed by the capacitor 2-122*b* and the inductor 2-140*b* will act as a filter for filtering the higher frequency noise 405*b* that is superimposed on the mains voltage signals 2-115*b*. When the capacitor 2-122*b* and the inductor 2-140*b* filter the noise 405*b*, the mains voltage signal 2-115*b* will have a smoother waveform line portion 410*b* that indicates the filtering of noise from the signal 2-115*b*.

Figure 5:
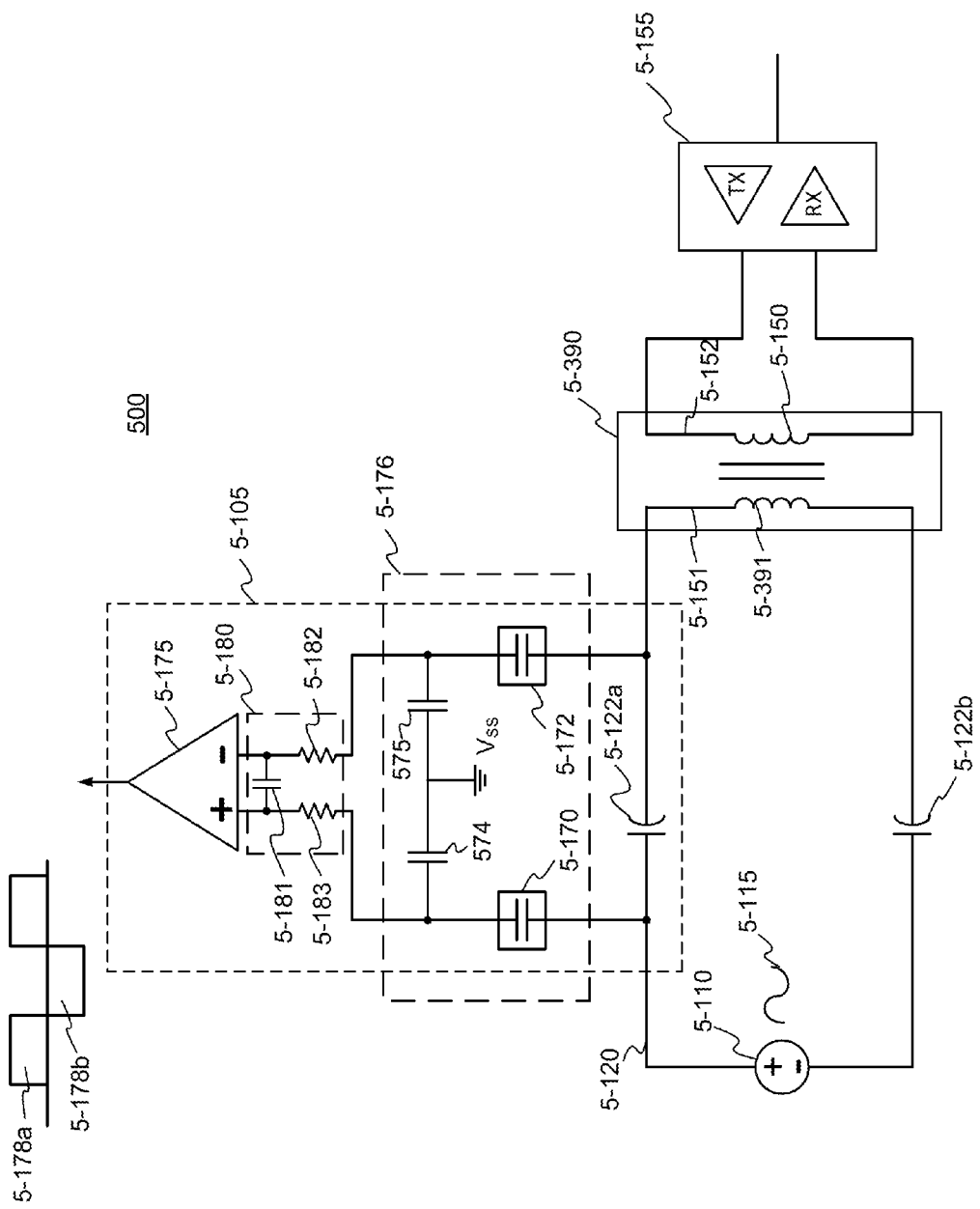
FIG. 5 is a block diagram of a system with a zero crossing detector (ZCD) circuit, in accordance with another embodiment of the disclosure.

FIG. 5 is a block diagram of a system 500 with a zero crossing detector (ZCD) circuit 5-105, in accordance with another embodiment of the disclosure. The ZCD circuit 5-105 was similarly discussed above with regard to circuit 1-105 and/or circuit 2-105 in FIGS. 1 through 4. The coupling unit 5-390 in the power line 5-120 is a transformer 5-390 with primary side windings 5-391 at the transformer primary side 5-151 and secondary side windings 5-150 at the transformer secondary side 5-152.

In an embodiment of the disclosure, the zero cross detector (ZCD) circuit 5-105 has an input coupled to a first plate (and second plate) of the capacitor 5-122*a* on the power line 5-120. As similarly discussed above, the ZCD circuit 5-105 includes a first capacitor 5-170 with a first plate connected to the first plate of the capacitor 5-122*a*. The ZCD circuit 5-105 also includes a second capacitor 5-172 with a first plate connected to the second plate of the capacitor 5-122*a* on the power line 5-120. The ZCD circuit 5-105 also includes a third capacitor 574. The first plate of the third capacitor 574 is connected to the second plate of the capacitor 5-170 and to the filter 5-180. The second plate of the third capacitor 574 is connected to the ground voltage Vss and to the second plate of a fourth capacitor 575. The first plate of the fourth capacitor 575 is connected to the filter 5-180 and to the second plate of the capacitor 5-172.

In one embodiment of the ZCD circuit 5-105, the capacitors 5-170 and 5-172 are printed circuit boards (PCB) capacitors and the capacitors 574 and 575 are discrete capacitors such as Class X or Y capacitors or ceramic capacitors. In another embodiment of the ZCD circuit 5-105, the capacitors 5-170, 5-172, 574 and 575 are discrete capacitors.

The ZCD circuit 5-105 also includes a comparator 5-175 with a positive input (+) that is connected (via the filter 5-180) to the first plate of the capacitor 574 and to the second plate of the capacitor 5-170. The comparator 5-175 also has a negative input (−) that is connected (via the filter 5-180) to the first plate of the capacitor 575 and the second plate of the capacitor 5-172. The filter 5-180 is similarly described above with reference to the filter 2-180 in FIG. 2.

The capacitors 5-170, 5-172, 574, and 575 form a capacitive divider 5-176 that divides the mains voltage signals 5-115 into the lower voltage signals as similarly discussed above with reference to FIGS. 1 and 2. The zero crossing points that are detected by the ZCD circuit 5-105 are represented by the edges of the waveform pulses 5-178*a* and 5-178*b*.

The connection of the ZCD circuit 5-105 in the power line 5-120 permits the primary windings 5-391 to be used in the transformer primary side 5-151 without any or without substantial modification to the primary windings 5-391. This configuration permits savings in costs and time for the manufacture of the system 500.

In the capacitive divider discussed above (e.g., the capacitive divider 2-176 in FIG. 2), any leakage current flowing into the comparator 2-175 will result in a phase shift of the lower voltage signals 2-177*a* and 2-177*b*. As a result, the output signal (e.g., the waveform 2-178 with the pulses 2-178*a* and 2-178*b*) of the ZCD circuit 2-105 (FIG. 2) will shift in phase, and the circuit 2-105 will not be able to accurately detect the position of the zero crossing points of the mains voltage signal 2-115 for purposes of synchronization. In order to minimize this phase shift effect due to the leakage current into the comparator 2-175, a high input impedance to the comparator 2-175 is typically preferable.

Accordingly, in accordance with an embodiment of the disclosure, a high input impedance circuit (circuit 600 in FIG. 6 or circuit 700 in FIG. 7) is connected to the input of the comparator 2-175 (FIG. 2) or to the input of the comparator 5-175 (FIG. 5) in order to provide a given amount of voltage biasing to the input of the comparator 2-175 or comparator 5-175. As also will be discussed below, the circuit 600 (FIG. 6) and/or the circuit 700 (FIG. 7) will control the voltage shift of the common mode of the voltage signal Vin that is received by the comparator 2-175 (FIG. 2) and that is the output of the capacitive divider 2-176 (FIG. 2). Each of the embodiments of the high input impedance circuit (e.g., circuit 600 or circuit 700) can be connected to the ZCD circuit 200 (FIG. 2) or to the ZCD circuit 500 (FIG. 5).

Figure 6:
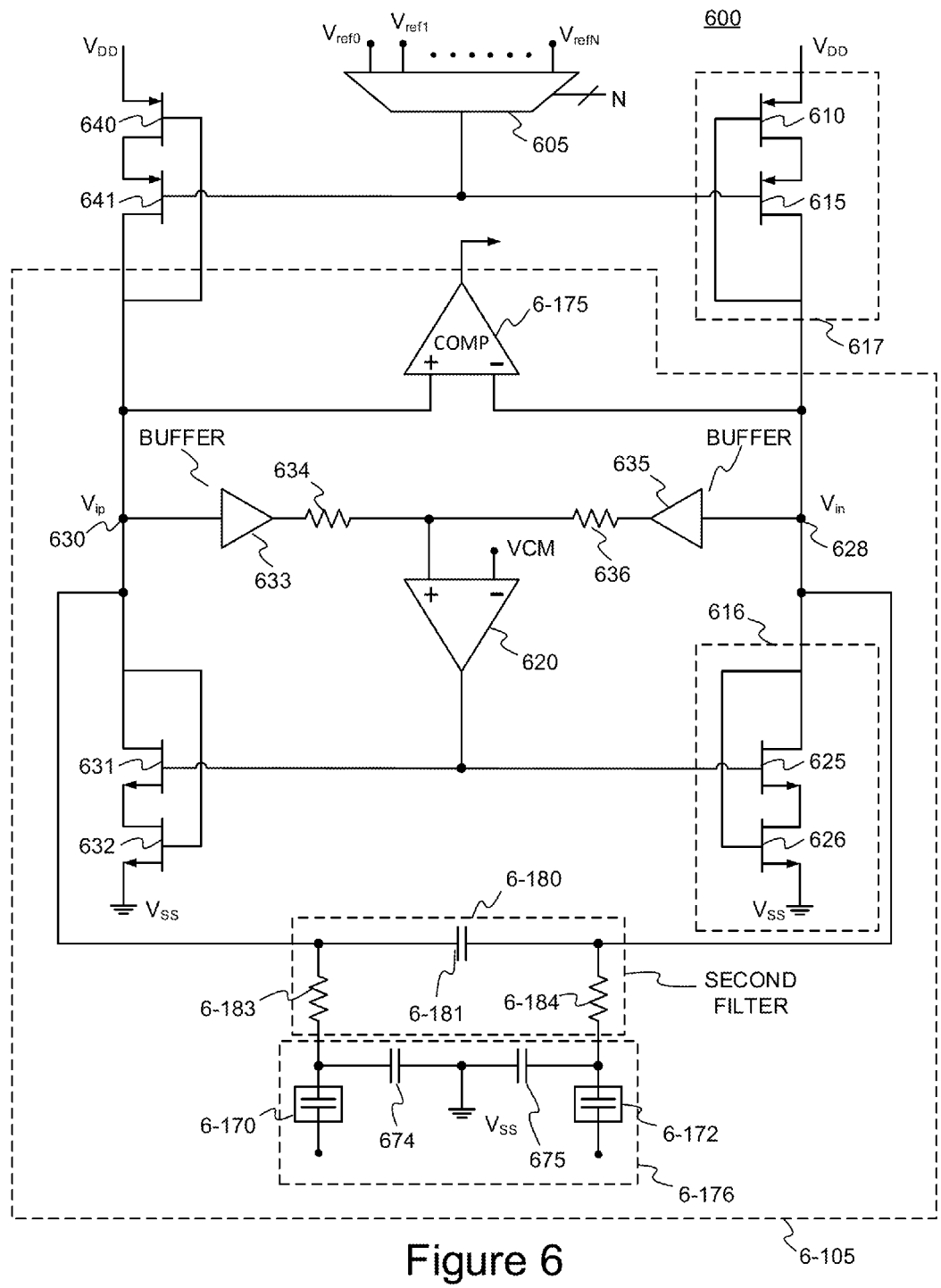
FIG. 6 is a diagram of a ZCD circuit and a high input impedance circuit connected to the ZCD circuit, in accordance with an embodiment of the disclosure.

FIG. 6 is a diagram of a ZCD circuit 6-105 and a high input impedance circuit 600 connected to the ZCD circuit 6-105, in accordance with an embodiment of the disclosure. The impedance circuit 600 is connected to the output of the capacitive divider 6-176 and to the positive input (+) and negative (−) input of the comparator 6-175. In an embodiment the impedance circuit 600 is connected (via the second filter 6-180) to the output of the capacitive divider 6-176. The capacitive divider 6-176 is similarly described above with reference to the capacitive dividers 5-176 or 2-176. The second filter 6-180 is similarly described above with reference to the second filters 5-180 or 2-180. The output of the capacitive divider 6-176 is expressed as Vin at node 628 and as Vip at node 630. The impedance circuit 600 is a differential circuit.

In an embodiment, the impedance circuit 600 includes a voltage selector 605, transistors 610, 615, 625, and 626, and a voltage amplifier 620. As an example, the transistors 610 and 615 can be PMOS transistors and the transistor 625 and 626 can be NMOS transistors. An output of the buffer 635 is connected (via the resistor 636) to the positive input (+) of the voltage amplifier 620. The input of the buffer 635 is connected via node 628 to the transistors 615 and 625 and the negative input (−) of the comparator 6-175. The node 628 is also connected (via the second filter 6-180) to an output of the voltage divider 6-176 (via the second plate of the capacitor 6-172 and the first plate of the capacitor 675).

The transistors 631, 632, 640, and 641, node 630, buffer 633, resistor 634, and second filter 6-180 are connected or configured as shown in FIG. 6, in a similar manner as discussed for the corresponding components in the above paragraph. Therefore, the node 630 is also connected (via the second filter 6-180) to an output of the voltage divider 6-176 (via the second plate of the capacitor 6-170 and the first plate of the capacitor 674).

The voltage selector 605 is biased by a positive voltage value Vdd and can be programmed to select at least one or more of the voltages Vref0, Vref1, Vref2, through VrefN, where N is an integer. The Vdd voltage value can be, for example, approximately 2.5 volts. The transistor 615 is also connected to the node Vin. The gate of the transistor 615 is connected to the output of the voltage selector 605.

The positive input (+) of the amplifier 620 is connected to the node 628 and to the positive input (+) of the comparator 6-175 of the ZCD circuit 6-105. The negative input (−) of the amplifier 620 is connected to a reference voltage source VCM that will be discussed below.

The node 628 (which transmits the voltage Vin) is also connected to the negative input (−) of the comparator 6-175. The voltage value of Vin is the output voltage of the capacitive divider 6-176 (which is formed by the capacitors 6-170, 6-172, 674, and 675).

The comparator 6-175 can be in an integrated circuit, such as the integrated circuit that includes the PLC Analog Front End 2-155 (FIG. 2) or in a different integrated circuit. Any leakage current into an integrated circuit of the comparator 6-175 will typically shift the phase of the voltage signal Vin that is generated by the capacitive divider 6-176. Due to the phase shift of this voltage output at node 628 (Vin), the comparator 6-175 will not be able to perform an accurate Zero Crossing Point detection of the mains voltage signal 2-115 (FIG. 2). Therefore, as will be discussed further below, the circuit 600 (FIG. 6) and 700 (FIG. 7) are each configured to provide a relatively high impedance value at the node 628 in order to substantially prevent the phase shift of the voltage signal Vin at node 628.

In an embodiment of the disclosure, the circuit 600 provides the transistors 625 and 626 that function as a current source. Since the transistors 625 and 626 are connected between the node 628 (or electrical path 628) and reference voltage Vss and since the negative input (−) of the comparator 6-175 is also connected to the node 628, the current source function of the transistors 625 and 626 provides a relatively high impedance to the negative input (−) of the comparator 6-175. As shown and discussed, this negative input (−) of the comparator 6-175 is connected to the node 628. The current source function of the transistors 625 and 626 also provides the relatively high impedance to the node 628 at the input of the integrated circuit that includes the comparator 6-175. This relative high impedance at the negative input (−) of the comparator 6-175 and at the input of the IC with the comparator 6-175 will substantially prevent or substantially reduce the phase shift of the voltage output (Vin) of the capacitive divider 6-176. Therefore, the comparator 6-175 can perform an accurate Zero Crossing Point detection of the mains voltage signal 2-115 (FIG. 2). The amplifier 620 also corrects any shift in the common mode of the signal Vin as will be discussed below.

The voltage selector 605 controls the impedance value at the load 617. As shown in FIG. 6, this load 617 is at the output of the voltage selector 605 and includes the transistors 610 and 615. As further shown, the transistors 610 and 615 are coupled in series and are coupled between the positive voltage value Vdd and the node 628.

The transistors 610 and 615 together make a linear resistor 617. The voltage selector 605 selects the voltage to be provided to the gate of the transistor 615, based on the value of N that is input into, or programmed or configured in the voltage selector 605. This voltage, together with the gate-source voltage of 615, sets the source-drain voltage of 610, and hence the resistance of the transistor 610, since this transistor 610 is in the linear region. Based on the above discussion, the voltage selector 605 controls the impedance of the load 617.

As another example, the higher the input voltage from the voltage selector 605 to a gate of the transistor 615, the lower the source-drain voltage of 610 will be set. Therefore, resistance of the linear resistor 617 increases. This resistance, together with the resistance provided by the transistors 625 and 626 and controlled by the amplifier 620 regulated output voltage (across the linear resistance 616), provide the single ended input impedance Zin (the parallel of linear resistance elements 617 & 616). This single ended input impedance Zin is in the range of, for example, about one-hundred Mega-ohms, and may be up to, for example, almost approximately 1 Giga-ohms. This input impedance Zin is presented to the low voltage signal that is received by the comparator 6-175.

The amplifier 620 senses the common mode of the nodes 628 and 630 and fixes the nodes 628 and 630 to a voltage set by VCM. This is performed by controlling the resistance of the transistor 625 together with the transistor 626, through the gate voltage of the transistor 626, since the transistor 626 is in linear region, in the same manner as the transistor 610 is in the linear region. The output of the amplifier 620 sets the gate voltage value of the transistor 625 based on the VCM (common mode reference voltage) at the negative input (−) of the voltage amplifier 620 and the voltages at nodes 628 and 630 (as received by positive input (+) of the voltage amplifier 620). This VCM (common mode reference voltage) is set to a fixed voltage so that the differential input pair of the comparator 6-175, as well as the tail current of the comparator 6-175 are properly biased. The reference voltage level VCM can be generated by any suitable reference voltage source generator. The voltage value at node 628 is, therefore, fixed at the VCM voltage value and is applied to the low voltage signal received by the comparator 6-175.

The amplifier 620 measures the common mode at the two inputs of comparator 6-175. When this voltage rises, the gate of the transistor 625 increases also, as well as the drain-source voltage of the transistor 626. This way, the resistance of the linear resistance 616 decreases, and hence the voltage at the inputs of the comparator 6-175 is regulated to VCM.

Figure 7:
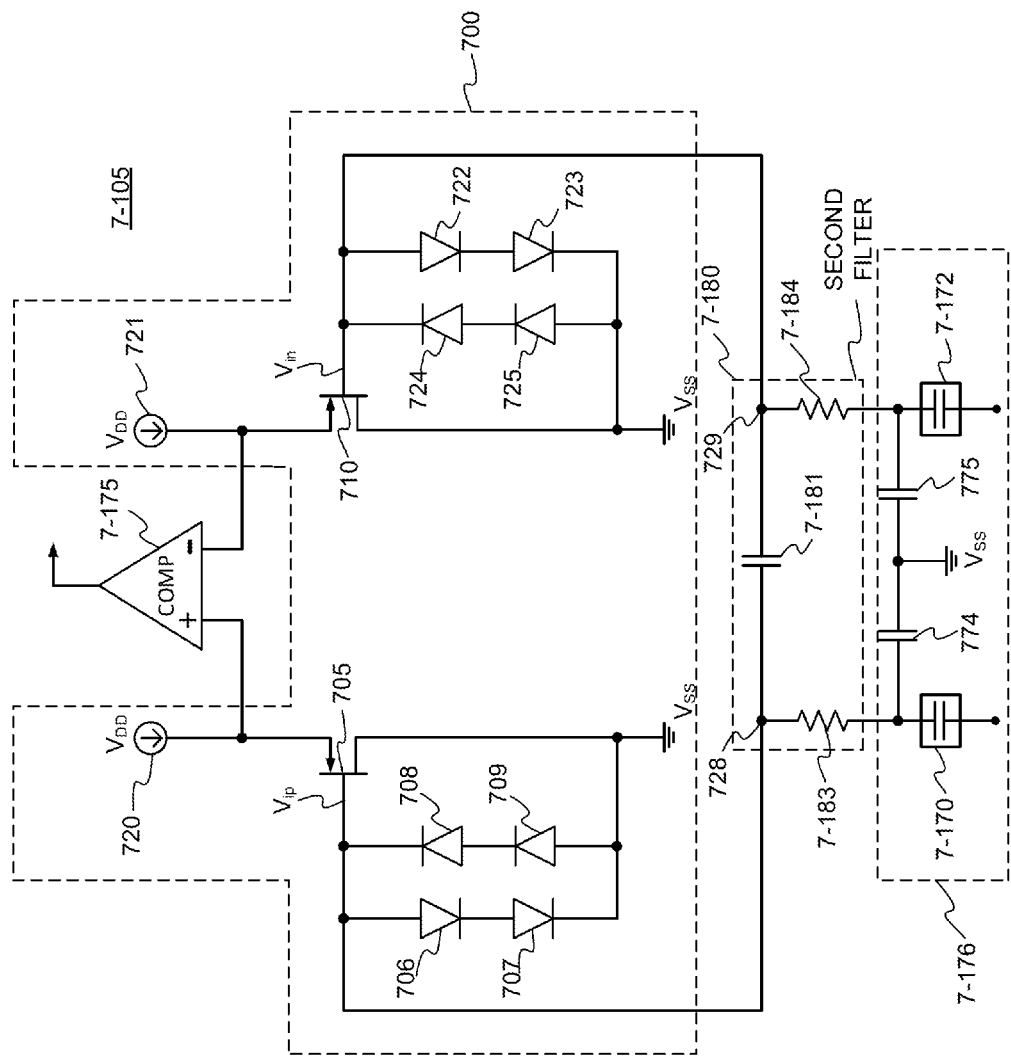
FIG. 7 is a diagram of a ZCD circuit and a high input impedance circuit connected to the ZCD circuit, in accordance with an embodiment of the disclosure.

FIG. 7 is a diagram of a ZCD circuit 7-105 and a high input impedance circuit 700 connected to the ZCD circuit 7-105, in accordance with an embodiment of the disclosure. The impedance circuit 700 is connected (via to the output of the second filter 7-180) to the voltage divider 7-176 and to the positive input (+) and negative input (−) of the comparator 7-175.

In an embodiment, the impedance circuit 700 includes a transistor 705, the forward diodes 706 and 707, the reverse diodes 708 and 709, and forward diodes 722 and 723 (in the negative input (−) branch of the comparator 7-175 and reverse diodes 724 and 725 (in the negative input (−) branch of the comparator 7-175, the transistor 710 (in the negative branch (−) of the comparator 7-175, and two current sources 720 and 721 (in the negative branch (−) of the comparator 7-175). The diodes 706 and 707 are connected to each other in series.

The forward diodes 706 and 707 are connected between the node 728 and the ground voltage level Vss. The reverse diodes 708 and 709 are connected between the node 728 and the ground voltage level Vss. The diodes 722, 723, 724, and 725 and transistor 710 are connected or configured as shown in FIG. 7, in a manner similar to the diodes 706-709 and the transistor 705. When a positive electrostatic discharge (ESD) pulse is generated, the two forward diodes 706 and 707 will turn on in response to protect the impedance circuit 700.

When a negative ESD pulse is generated, the two reverse diodes 708 and 709 will turn on. This topology allows removing the otherwise provided ESD protection to Vdd. Now since an ESD protection pad is connected by ESD devices to only one supply (Vss), this structure achieves zero leakage current flowing through the protected pad.

The transistor 705 has a gate connected to the node 728 which is an output node of the second filter 7-180. The transistor 705 is also connected between the ground voltage level Vss and the current source 720. The positive input (+) of the comparator 7-175 is connected to the transistor 705.

Similarly, the transistor 710 has a gate connected to the node 729 which is an output node of the second filter 7-180. The transistor 710 is also connected between the ground voltage level Vss and the current source 721. The negative input (−) of the comparator 7-175 is connected to the transistor 710. The circuit 700 will DC bias the voltage Vin to ground voltage Vss. The voltage Vin moves within a small range, for instance, from about −50 mV to about 50 mV. The voltage Vin (at node 729) is driven into the gate of the transistor 710. The voltage Vip (at node 728) is driven into the gate of the transistor 705. It is noted that the impedance circuit 700 is a differential circuit.

Because each of total threshold voltages of the forward diodes 706 and 707 or the reverse diodes 708 and 709 is greater than the voltage Vip, none of the diodes 706-709 turns on. Accordingly, little leakage current from the capacitors 7-170, 774, 775, and 7-172 flows through the diodes 706-709. In this manner, a phase shift of the low voltage signal 2-177a and 2-177b (FIG. 2) can be substantially prevented.

As described above, when the diodes 706-709 turn off under a normal range of the voltage Vip, the impedance provided by the diodes 706-709 is high. The input impedance of the transistor 705 is also high. Therefore, the input impedance Zin of the ZCD circuit 7-105 becomes high. For instance, the input impedance Zin is about 1 giga-ohm.

Additionally or alternatively, the device size of the ESD component can be appropriately sized so as to minimize the leakage currents from the ESD component.

Figure 8:
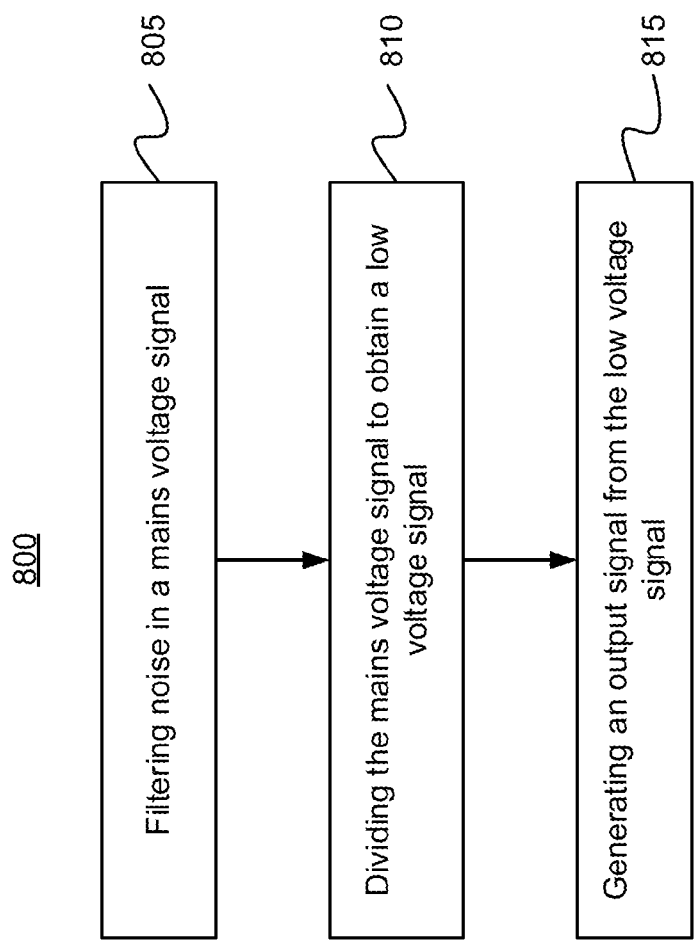
FIG. 8 is a flow diagram of a method for detecting zero crossing points, in accordance with an embodiment of the disclosure.

FIG. 8 relates to a flowchart of a method 800 for a detecting zero crossing point scheme, in accordance with an embodiment of the disclosure. At 805, the method 800 filters high frequency noise that is superimposed on the mains voltage single 1-115 (FIG. 1). At 810, the method 800 divides the mains voltage signals 1-115a and 1-115b into the lower voltage signals 2-177a and 2-177b (FIG. 2) using the capacitive divider 2-176 (FIG. 2). In one embodiment, at 810, the method 800 divides the differential mode and the common mode of the main voltage signal to obtain a low voltage signal.

At 815, the method 800 generates the output signal 1-178 (FIG. 1) including zero crossing points of the mains voltage signal 1-115.

Other variations and modifications of the above-described embodiments and methods are possible in light of the teaching discussed herein.

It is also within the scope of the disclosure to implement a program or code that can be stored in a machine-readable or computer-readable medium to permit a computer to perform any of the techniques described above, or a program or code that can be stored in an article of manufacture that includes a computer readable medium on which computer-readable instructions for carrying out embodiments of the inventive techniques are stored. Other variations and modifications of the above-described embodiments and methods are possible in light of the teaching discussed herein.

The above description of illustrated embodiments of the disclosure, including what is described in the Abstract, is not intended to be exhaustive or to limit the disclosure to the precise forms disclosed. While specific embodiments of, and examples for, the embodiments are described herein for illustrative purposes, various equivalent modifications are possible within the scope of the disclosure, as those skilled in the relevant art will recognize.

These modifications can be made to the embodiments in light of the above detailed description. The terms used in the following claims should not be construed to limit the disclosure to the specific embodiments disclosed in the specification and the claims. Rather, the scope of the disclosure is to be determined entirely by the following claims, which are to be construed in accordance with established doctrines of claim interpretation.

What is claimed is:

1. A method comprising:
    filtering noise in a mains voltage signal;
    dividing the mains voltage signal in order to obtain a low voltage signal using a capacitive divider, the low voltage signal having a magnitude lower than a magnitude of the mains voltage signal, wherein the capacitive divider includes a plurality of capacitors; and
    generating an output signal from the low voltage signal, wherein the output signal indicates a zero crossing point of the mains voltage signal.

2. The method of claim 1, wherein the zero crossing point is used to provide synchronization of additional voltage signals with the mains voltage signal.

3. The method of claim 1, wherein the low voltage signal comprises a first low voltage signal and a second low voltage signal.

4. The method of claim 1, wherein generating the output signal comprises:
    generating a first low voltage signal and a second low voltage signal;
    comparing the first and second low voltage signals;
    outputting a positive pulse if the first low voltage signal is greater than the second low voltage signal; and
    outputting a negative pulse if the first low voltage signal is less than the second low voltage signal.

5. The method of claim 1, further comprising:
    providing a given amount of voltage biasing to the low voltage signal prior to generating the output signal from the low voltage signal.

6. The method of claim 5, wherein providing the given amount of voltage biasing comprises: controlling an impedance value that is presented to the low voltage signal.

7. The method of claim 5, wherein providing the given amount of voltage biasing further comprises: controlling a DC value of the voltage biasing that is presented to the low voltage signal.

8. The method of claim 5, wherein providing the given amount of voltage biasing further comprises: providing a current source function to control an impedance value applied to the low voltage signal.

9. The method of claim 1, further comprising:
    providing electro-static discharge (ESD) protection to a node that transmits the low voltage signal.

10. The method of claim 1, wherein generating the output signal comprises:
    generating a first low voltage signal and a second low voltage signal; and
    comparing the first and second low voltage signals,
    wherein the first and second low voltage signals are AC signals.

11. A method comprising:
    filtering noise in a mains voltage signal;

dividing the mains voltage signal in order to obtain a low voltage signal, the low voltage signal having a magnitude lower than a magnitude of the mains voltage signal; and generating an output signal from the low voltage signal, wherein the output signal indicates a zero crossing point of the mains voltage signal, and wherein dividing the mains voltage signal comprises dividing a differential mode and a common mode of the mains voltage signal.

12. A system comprising:

a coupling unit connected between a high voltage side and a low voltage side of the system; and a zero crossing detector connected to the high voltage side and configured to obtain a low voltage signal by dividing a filtered mains voltage signal and to generate an output signal that indicates a zero crossing point of the filtered mains voltage signal, the low voltage signal having a magnitude lower than a magnitude of the filtered mains voltage signal, wherein the zero crossing detector includes a capacitive divider that has a plurality of capacitors to divide the filtered main voltage signal.

13. The system of claim 12, wherein the zero crossing point is used to provide synchronization of additional voltage signals with the mains voltage signal.

14. The system of claim 12, wherein the capacitive divider generates a first low voltage signal and a second low voltage signal.

15. The system of claim 14, wherein the zero crossing detector generates a positive pulse if the first low voltage signal is greater than the second low voltage signal, and a negative pulse if the first low voltage signal is less than the second low voltage signal.

16. The system of claim 12, further comprising:

a biasing circuit configured to provide a given amount of voltage biasing to the low voltage signal prior to generating the output signal from the low voltage signal.

17. The system of claim 16, wherein the biasing circuit is configured to control an impedance value that is presented to the low voltage signal.

18. The system of claim 16, wherein the biasing circuit is configured to control a DC value of the voltage biasing that is presented to the low voltage signal.

19. The system of claim 16, wherein the biasing circuit is configured to provide the given amount of voltage biasing by providing a current source function to control an impedance value applied to the low voltage signal.

20. The system of claim 12, further comprising:

an impedance circuit configured to provide electro-static discharge (ESD) protection to a node that transmits the low voltage signal.

21. The system of claim 12, wherein the zero crossing detector is configured to divide a differential mode and a common mode of the mains voltage signal.

22. The system of claim 12, wherein the low voltage signal includes a first low voltage signal and a second low voltage signal, both of which are AC signals, and wherein the zero crossing detector further includes a comparator configured to compare the first and second low voltage signals to generate the output signal.

* * * * *